United States Patent
Inoue et al.

(10) Patent No.: US 8,166,875 B2
(45) Date of Patent: May 1, 2012

(54) SCREEN PRINTING APPARATUS AND SCREEN PRINTING METHOD

(75) Inventors: Masafumi Inoue, Saga (JP); Fumio Kikutsugi, Fukouka (JP); Masahiro Kihara, Fukuoka (JP)

(73) Assignee: Panasonic Corporation, Osaka (JP)

( * ) Notice: Subject to any disclaimer, the term of this patent is extended or adjusted under 35 U.S.C. 154(b) by 1016 days.

(21) Appl. No.: 12/123,959

(22) Filed: May 20, 2008

(65) Prior Publication Data

US 2008/0289518 A1 Nov. 27, 2008

(30) Foreign Application Priority Data

May 22, 2007 (JP) .................. 2007-135134

(51) Int. Cl.
*B41M 1/12* (2006.01)
*H01L 21/44* (2006.01)
(52) U.S. Cl. ......... 101/129; 101/126; 101/128; 438/612
(58) Field of Classification Search .................. 101/126, 101/129, 123; 438/612, 613; 228/180.22
See application file for complete search history.

(56) References Cited

U.S. PATENT DOCUMENTS

| | | | |
|---|---|---|---|
| 5,452,656 A * | 9/1995 | Becher et al. ................. | 101/126 |
| 5,812,693 A | 9/1998 | Burt et al. | |
| 5,882,720 A | 3/1999 | Legault et al. | |
| 6,066,206 A * | 5/2000 | Doyle et al. ................. | 427/98.5 |
| 2002/0041241 A1* | 4/2002 | Oberhauser ................... | 341/111 |
| 2003/0167941 A1* | 9/2003 | Lin et al. ........ | 101/123 |
| 2004/0079244 A1* | 4/2004 | Yamasaki et al. ............. | 101/123 |
| 2004/0085701 A1* | 5/2004 | Inoue et al. .................... | 361/135 |
| 2004/0244613 A1 | 12/2004 | Barajas et al. | |
| 2010/0242755 A1* | 9/2010 | Nagao ........................... | 101/126 |
| 2011/0146508 A1* | 6/2011 | Mizuno et al. ................ | 101/126 |

FOREIGN PATENT DOCUMENTS

| | | |
|---|---|---|
| EP | 0906827 | 4/1999 |
| JP | 02-248252 | 10/1990 |
| JP | 06-112295 | 4/1994 |
| JP | 2000211106 | 8/2000 |
| JP | 2003191432 | 7/2003 |
| JP | 2005-014325 A | 1/2005 |
| JP | 2007-096153 A | 4/2007 |

OTHER PUBLICATIONS

Kurihara, Hirokuni JP 2005-14325 Machine Translation.*
Kurihara, Hirokuni JP 2007-096153 Machine Translation.*
Japanese Office Action dated Apr. 16, 2009.
Search report dated Jun. 3, 2008.

* cited by examiner

*Primary Examiner* — Daniel J Colilla
*Assistant Examiner* — Allister Primo
(74) *Attorney, Agent, or Firm* — Pearne & Gordon LLP

(57) ABSTRACT

In supply of feedback data to improve a positional deviation quantity and a deviation state of a soldering paste printed on individual substrates held on the carrier, a plurality of average values of individual positional deviation for each of the individual substrates are obtained, and then, if the deviation value ΔM indicating a difference between the maximum value Mmax and the minimum value Mmin of the plurality of average values M of individual positional deviation is less than or equal to the tolerance value Δ(t), an intermediate value of the maximum value Mmax and the minimum value Mmin is obtained, and the positioning parameters of the mask plate and the carrier are corrected based on the intermediate value (Mmax+Mmin)/2.

3 Claims, 8 Drawing Sheets

SCREEN PRINTING APPARATUS AND SCREEN PRINTING METHOD

BACKGROUND OF THE INVENTION

1. Field of the Invention

The present invention relates to a screen printing apparatus and a screen printing method for printing a soldering paste with respect to a plurality of individual substrates held on a carrier.

2. Related Art

An electronic component mounting system for manufacturing a component-mounted substrate by soldering and connecting electronic components on a substrate is configured by connecting a plurality of a solder printing apparatus, an electronic component mounter, a reflow apparatus, etc. In such an electronic component mounting system, inspection devices are disposed between respective apparatuses for the purpose of carrying out quality control at high reliability, and are given a function of automatically determining suitability of component mounting operations (For example, refer to Japanese Patent No. 3344739).

In the example shown by Japanese Patent No. 3344739 described above, in a component mounted substrate manufacturing system that is configured by connecting a plurality of operation portions such as a solder printing portion, a component mounting portion, a soldering portion, etc., inspection devices are disposed at respective portions to detect predetermined monitoring points. For example, a solder printing inspection device is disposed at the solder printing portion, which detects monitoring points of a printing state such as thin spots in soldering, positional deviation of printing, etc. And, where these detection points come out of a normal range and are in a warning range, operation control instructions to change the operation status and to correct the same are outputted to facilities positioned at the upstream and downstream sides. For example, where a printing position has deviated in a specified direction, an operation change instruction is outputted to the upstream printing device to correct the positional deviation, and an operation change instruction to correct the component mounting position corresponding to the positional deviation is outputted with respect to the downstream component mounting devices.

In recent years, small-sized mounted substrates have been widely used in line with downsizing of electronic apparatuses. In many cases, generally, component mounting work with respect to such small-sized mounted substrates is collectively carried out with respect to a plurality of substrates, and such a mode is adopted, in which a plurality of small-sized individual substrates are held on a carrier. However, if an inspection function of a conventional electronic component mounting line including the related art example described above is applied to a component mounting mode in which such a plurality of individual substrates are held on the carrier, the following problems are brought about.

That is, a plurality of individual substrates are not necessarily held in accurate positions set in advance in a carrier when holding these individual substrates on the carrier. Usually, the holding positions thereof become uneven in a specified range. Where a specified individual substrate greatly slips due to a certain cause in comparison with the other substrates and is in an abnormal state, if the printing position is corrected in a printing device using soldering position information obtained by the print inspection device as it is, incorrect data resulting from the abnormal state is brought in as feedback data. Resultantly, inappropriate correction data is fed back to the upstream side. Thus, in the conventional screen printing apparatus, there may be cases where appropriate printing position data cannot be fed back in a component mounting mode in which a plurality of individual substrates are held on the carrier.

SUMMARY OF THE INVENTION

It is therefore an object of the present invention to provide a screen printing apparatus and a screen printing method, which are capable of executing feedback of appropriate printing positions in a component mounting mode in which a plurality of individual substrates are held.

A screen printing apparatus according to the present invention is a screen printing apparatus for collectively printing a soldering paste on electrodes for connecting electronic components, which are formed on individual substrates, with respect to a plurality of individual substrates held on a carrier, comprising:

a mask plate provided with pattern holes corresponding to the electrodes;

a positioning device for two-dimensionally positioning the carrier with respect to the mask plate based on positioning parameters;

a squeegee for printing a soldering paste on the electrodes via the pattern holes by executing a squeegeeing motion in sliding contact with the mask plate;

a print inspection portion for detecting a position of the soldering paste printed on each individual substrate and detecting position deviation of the soldering paste with respect to the electrodes as soldering position deviation data indicating positional deviation quantity for the electrodes;

a feedback data supply portion for supplying feedback data to improve the positional deviation state based on statistical data of positional deviation for individual substrates, in which the positional deviation quantities are statistically processed for each individual substrate and a data updating portion for updating the positioning parameters based on the feedback data.

A screen printing method according to the present invention is a screen printing method for collectively printing a soldering paste on electrodes for connecting electronic components, which are formed on individual substrates, with respect to a plurality of individual substrates held on a carrier, by a screen printing apparatus, wherein the screen printing apparatus comprises:

a mask plate provided with pattern holes corresponding to the electrodes;

a positioning device for two-dimensionally positioning the carrier with respect to the mask plate based on positioning parameters;

a squeegee for printing a soldering paste on the electrodes via the pattern holes by executing a squeegeeing motion in sliding contact with the mask plate; and a print inspection portion for detecting a position of the soldering paste printed on each of the individual substrates and detecting positional deviation of the soldering paste with respect to the electrodes as soldering position deviation data indicating a positional deviation quantity for each electrode; and a feedback data supplying step for supplying feedback data to improve a positional deviation state based on statistical data of positional deviation for individual substrates, in which the positional deviation quantities are statistically processed for each individual substrate, comprising the steps of:

obtaining a plurality of average values of individual positional deviation quantities from the soldering position deviation data which indicate an average value of the positional deviation quantity for each individual substrate;

comparing a deviation value indicating a difference between a maximum value and a minimum values of the average values of positional deviation quantities with tolerance values predetermined in advance; and carrying out a calculation for supplying feedback data, by which a mean value of the maximum value and the minimum value is obtained, if the deviation value is less than or equal to the tolerance value, and updating the positioning parameters based on the mean value.

According to the present invention, the feedback data supplying step for supplying feedback data to improve the positional deviation state of a soldering paste obtains a plurality of average values of individual positional deviation quantities, which indicates the average value of the positional deviation quantity for each individual substrate, and then carries out a calculation for supplying feedback data, by which a mean value of the maximum value and the minimum value is obtained, if the deviation value indicating a difference between the maximum value and the minimum value of a plurality of average values of individual positional deviations is less than or equal to the tolerance value, whereby it is possible to carry out feedback of appropriate printing positions by correcting the positioning parameters of a mask plate based on the obtained mean values even in a case where a specified individual substrate greatly slips due to a certain cause in comparison with the other individual substrates.

DETAILED DESCRIPTION OF THE PREFERRED EMBODIMENTS

Figure 1:
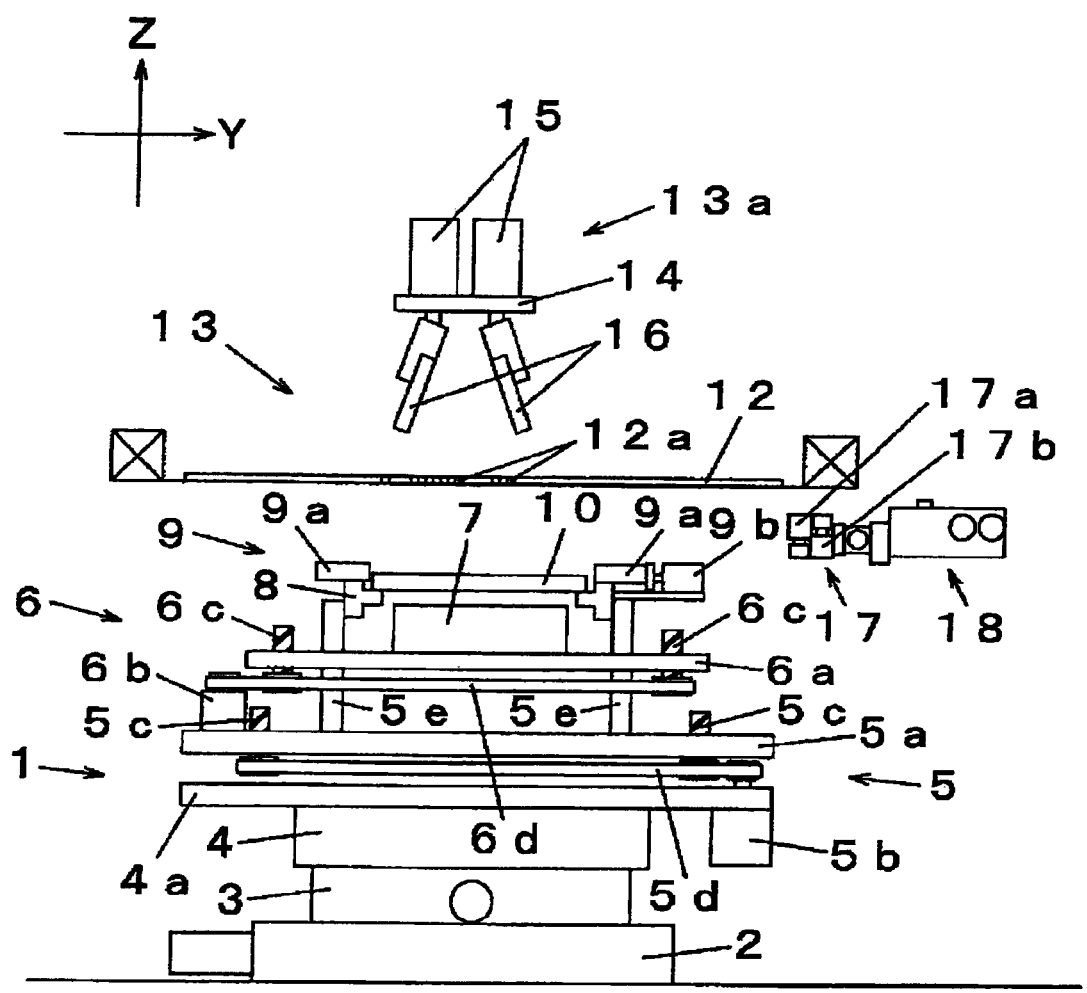
FIG. 1 is a front elevational view showing a screen printing apparatus according to one embodiment of the present invention.
Figure 2:
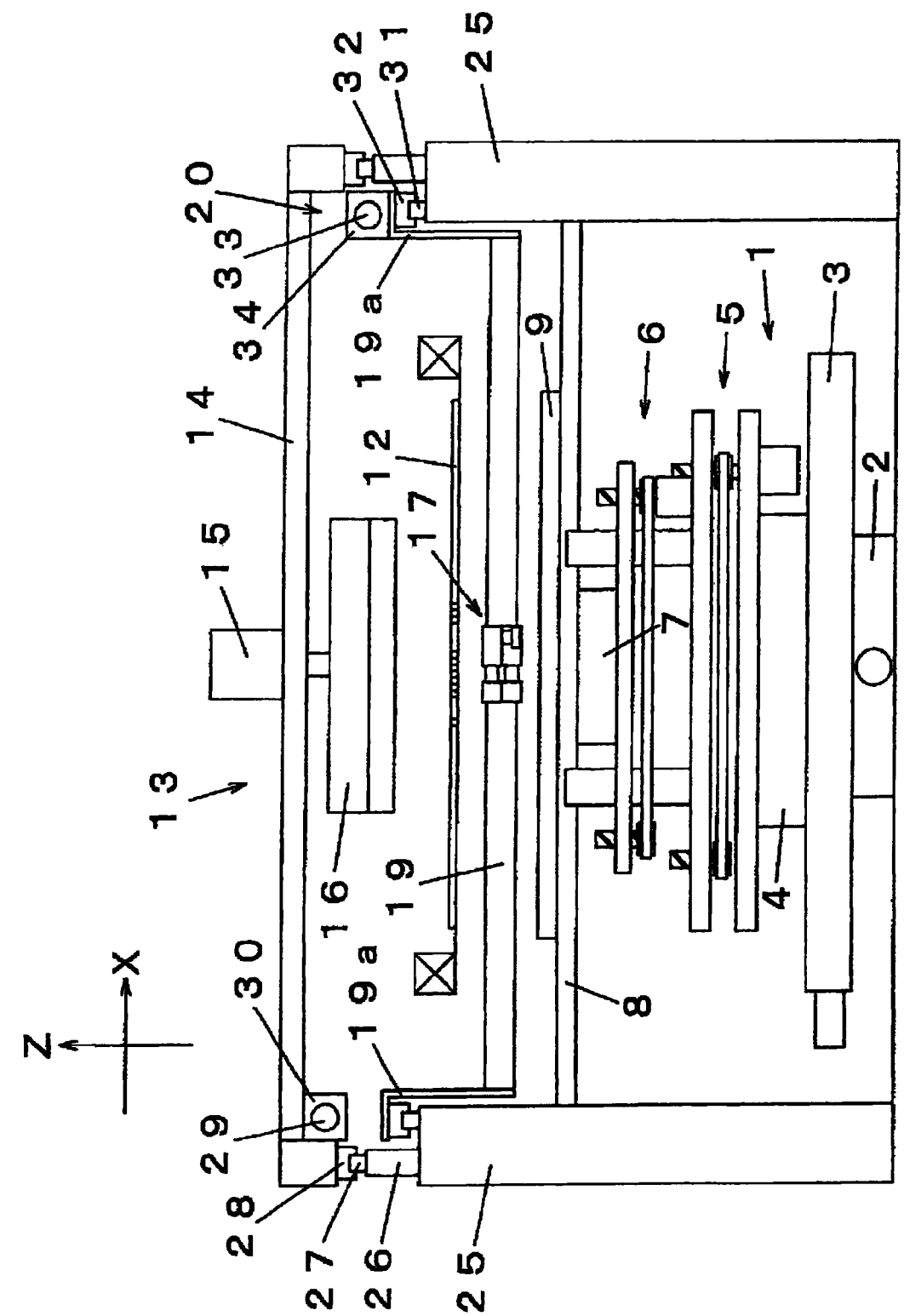
FIG. 2 is a side elevational view showing a screen printing apparatus according to one embodiment of the present invention.
Figure 3:
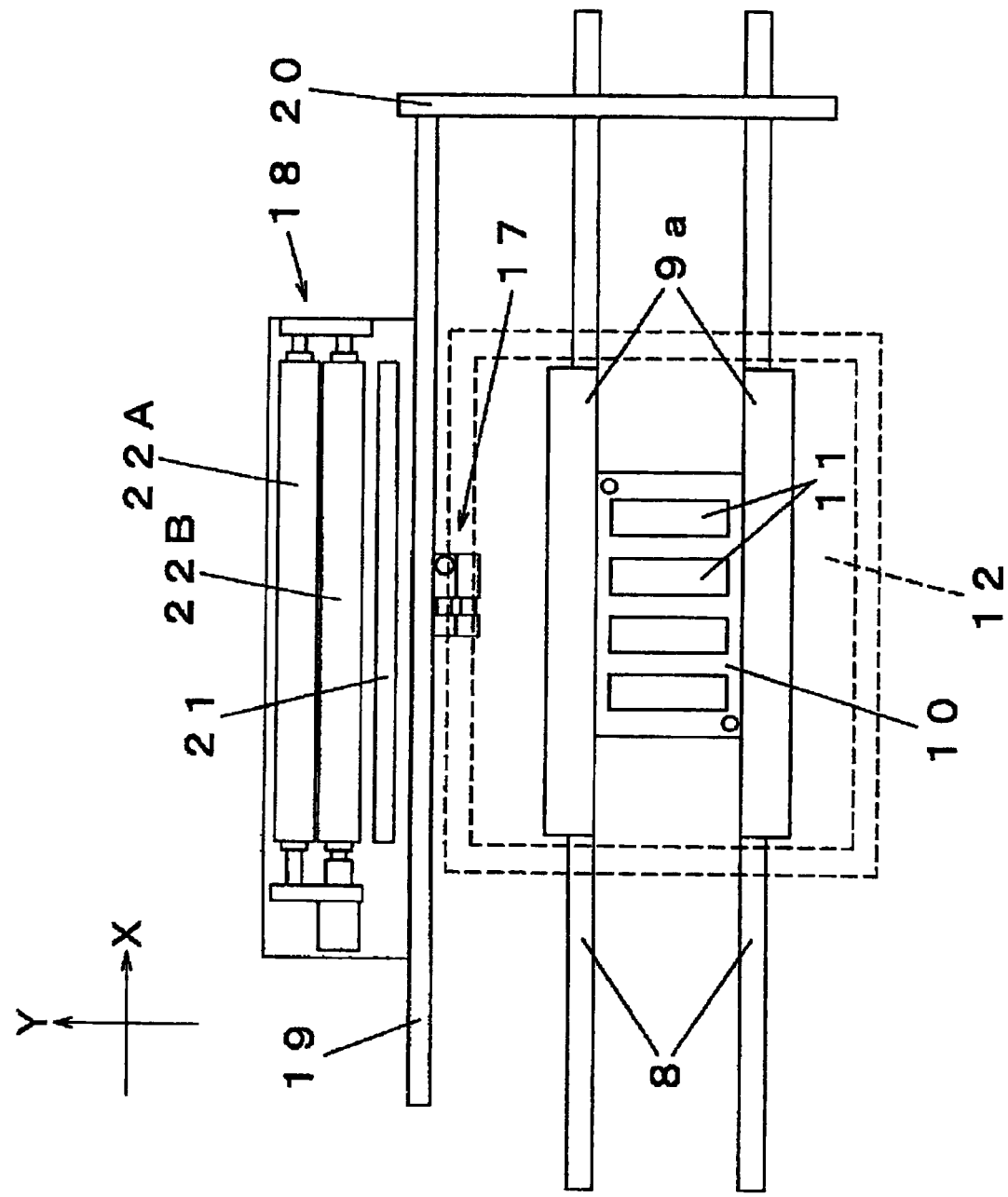
FIG. 3 is a plan view showing a screen printing apparatus according to one embodiment of the present invention.

Next, a description is given of an embodiment of the present invention with reference to the drawings. FIG. 1 is a front elevational view showing a screen printing apparatus according to one embodiment of the present invention, FIG. 2 is a side elevational view showing a screen printing apparatus according to one embodiment of the present invention, FIG. 3 is a plan view showing a screen printing apparatus according to one embodiment of the present invention, FIGS. 4A to 4C are schematic views showing individual substrates and mask plates in a screen printing apparatus according to one embodiment of the present invention, FIG. 5 is a block diagram showing a configuration of a control system of a screen printing apparatus according to one embodiment of the present invention, FIG. 6 is a schematic view showing soldering position deviation data in a screen printing method according to one embodiment of the present invention, FIG. 7 and FIG. 8 are schematic views showing a feedback data supplying step in the screen printing method according to one embodiment of the present invention.

First, referring to FIG. 1, FIG. 2 and FIG. 3, a structure of the screen printing apparatus will be described. The screen printing apparatus is used for collectively printing a soldering paste on electrodes for connecting electronic components, which are formed on each of the individual substrates with respect to a plurality of individual substrates held on a carrier. In FIG. 1, the screen printing apparatus is structured by disposing a screen printing mechanism 13 upward of a substrate positioning portion 1. The substrate positioning portion 1 is structured so that a Y-axis table 2, an X-axis table 3 and a θ-axis table 4 are stacked one on top of another, and a first Z-axis table 5 and a second Z-axis table 6 are combined thereon.

A description is given of the first Z-axis table 5. A horizontal base plate 5a is held on the upper surface side of a horizontal base plate 4a provided on the upper surface of the θ-axis table 4 so that it can be elevated by an elevation guide mechanism (not illustrated). The base plate 5a is elevated and lowered by a Z-axis elevation mechanism structured so that a plurality of feed screws 5c are rotated and driven via a belt 5d by a motor 5b. Vertical frames 5e are erected from the base plate 5a, and a substrate conveyance mechanism 8 is held on the upper end portions of the vertical frames 5e. The substrate conveyance mechanism 8 is provided with two lines of conveyance rails disposed parallel to the substrate conveyance direction (X direction: Perpendicular direction of the sheet of FIG. 1). These conveyance rails support both end portions of a carrier 10 and convey the same. By driving the first Z-axis table 5, the carrier 10 that is held by the substrate conveyance mechanism 8 is elevated and lowered along with the substrate conveyance mechanism 8 with respect to the screen printing mechanism 13.

Figure 4A:
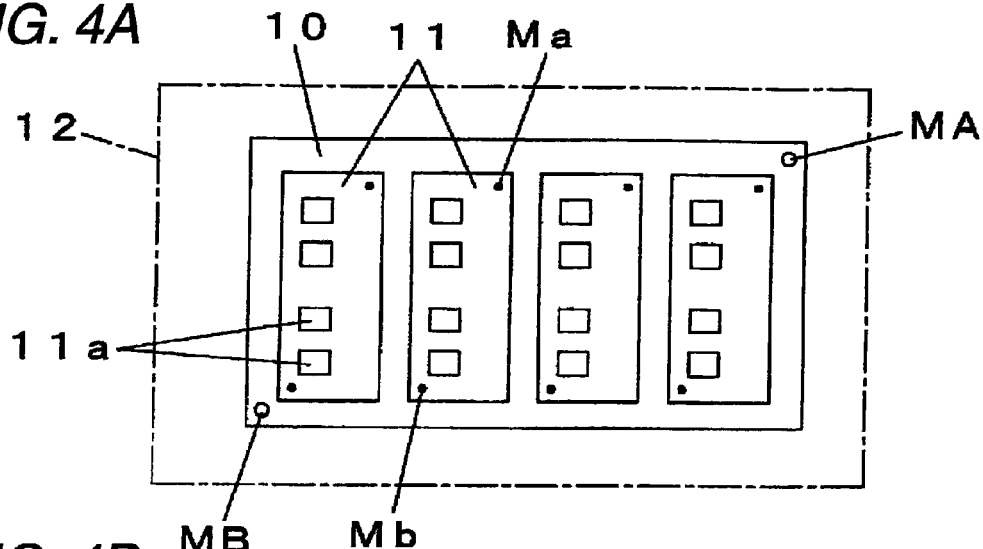
FIGS. 4A to 4C are schematic views showing individual substrates and a mask plate in a screen printing apparatus according to one embodiment of the present invention.
Figure 4B:
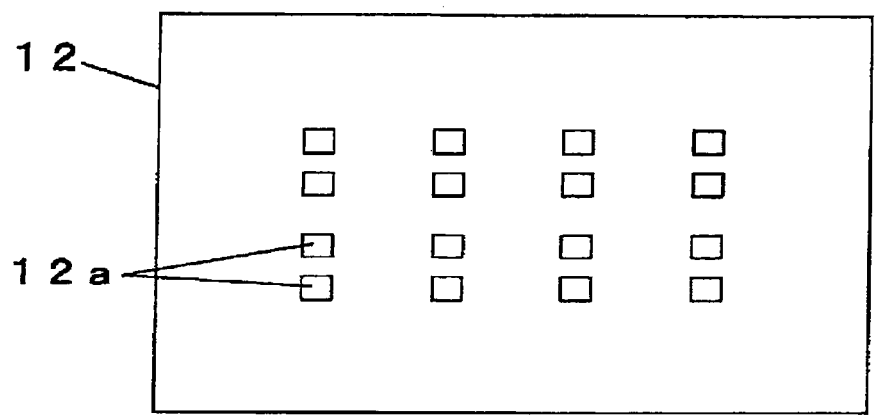
Figure 4C:
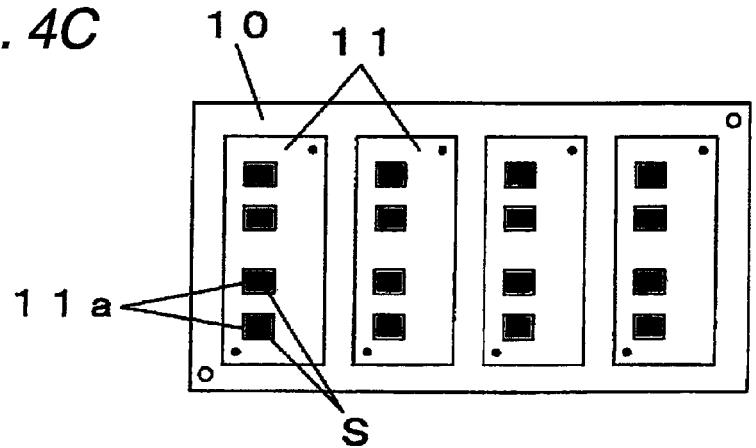
Figure 5:
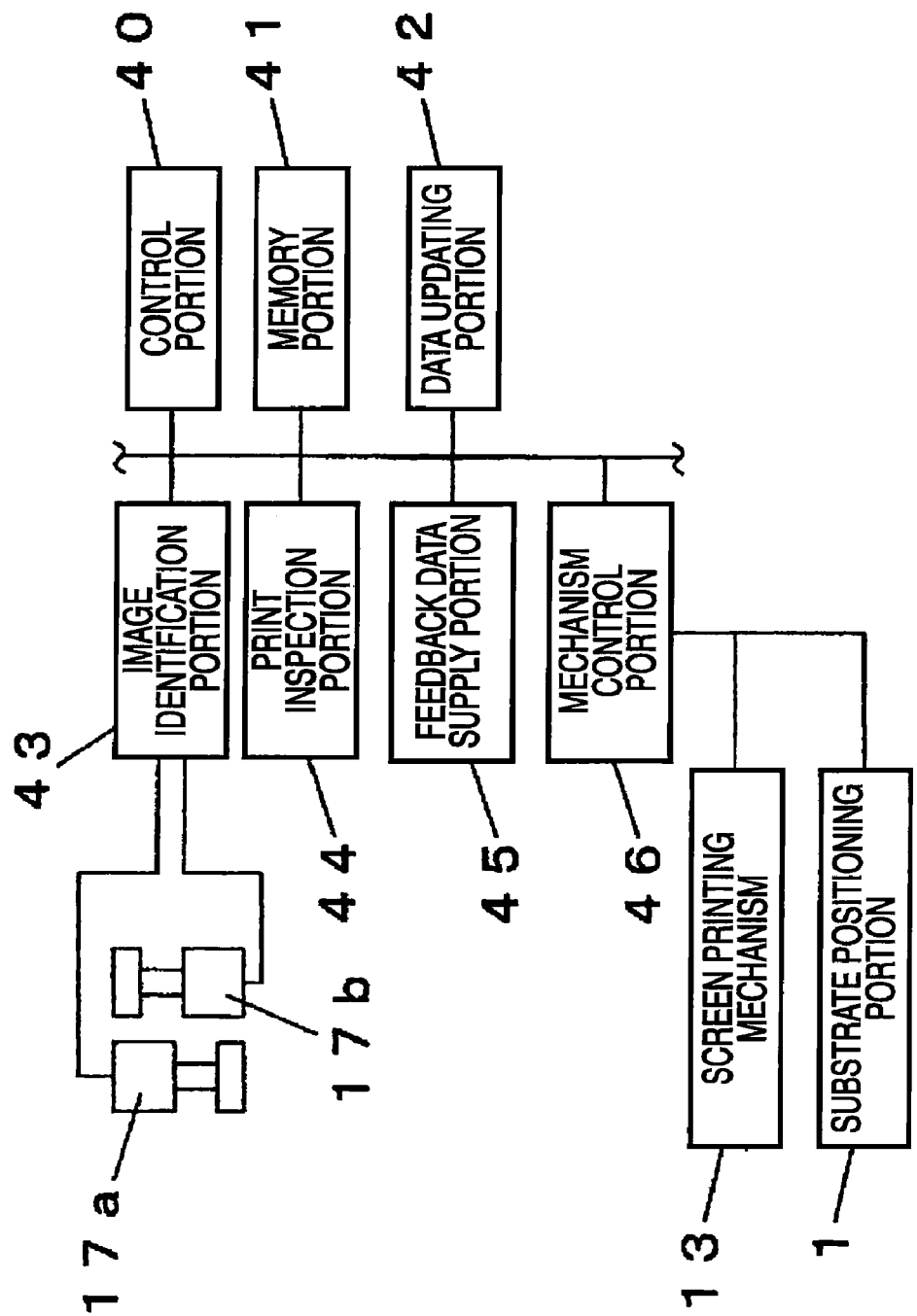
FIG. 5 is a block diagram showing a configuration of a control system of a screen printing apparatus according to one embodiment of the present invention.

As shown in FIG. 4A, a plurality of individual substrates 11 that are objects to be printed are held on the carrier 10. The individual substrates 11 are film-shaped resin substrates, and have a plurality of electrodes 11a formed thereon, to which electronic components are connected. By causing the individual substrates 11 to be pressed to an adhesive resin film formed on the surface of the carrier 10, the individual substrates 11 are held by the carrier 10 in a state where the plane positions thereof are fixed. Position identification marks MA and MB are formed on a pair of diagonal positions of the carrier 10, and position identification marks Ma and Mb are further formed on each of the individual substrates 11 also in order to identify the positions thereof. The relative positions of each of the electrodes 11a with respect to the position identification marks Ma and Mb at the individual substrates are given as electrode position data. By identifying the positions of the position identification marks Ma and Mb, it becomes possible to detect the positions of the electrodes 11a at the individual electrodes 11.

As shown in FIG. 2 and FIG. 3, the substrate conveyance mechanism 8 extends to the upstream side (the left side in FIG. 2 and FIG. 3) and to the downstream side, and the carrier 10 conveyed from the upstream side is conveyed by the substrate conveyance mechanism 8, and is further positioned by the substrate positioning portion 1. The carrier 10 holding individual substrates 11, on which printing is carried out by a screen printing mechanism described later, is conveyed to the downstream side by the substrate conveyance mechanism 8.

A description is given of a second Z-axis table 6. A horizontal base plate 6a is disposed at an intermediate part between the substrate conveyance mechanism 8 and the base plate 5a so that it can be elevated and lowered by an elevation guiding mechanism (not illustrated). The base plate 6a is elevated and lowered by a Z-axis elevation mechanism configured so that a plurality of feed screws 6c are driven and rotated by a motor 6b via a belt 6d. A substrate underside receiving portion 7, which is provided with an underside receiving plane having the carrier 10 held on the upper side thereof, is disposed on the upper side of the base plate 6a.

By driving the second Z-axis table 6, the substrate underside receiving portion 7 is elevated and lowered with respect to the carrier 10 held on the substrate conveyance mechanism 8. By the underside receiving plane of the substrate underside receiving portion 7 being brought into contact with the underside of the carrier 10, the substrate underside receiving portion 7 supports the carrier 10 from its underside. A clamp mechanism 9 is disposed on the upper side of the substrate conveyance mechanism 8. The clamp mechanism 9 is provided with two clamp members 9a that are disposed so as to be opposed to each other at the left and right sides, wherein, by causing one clamp member 9a to advance and retreat by means of a drive mechanism 9b, the carrier 10 is clamped from both sides thereof and fixed.

Next, a description is given of a screen printing mechanism 13 disposed above the substrate positioning portion 1. In FIG. 1 and FIG. 2, pattern holes 12a are provided in a mask plate 12 spreading in a mask frame. The pattern holes 12a are provided to correspond to the shape and position (Refer to FIG. 4A) of electrodes 11a in an individual substrate 11 held on the carrier 10. A squeegee head 13a is disposed on the mask plate 12, and the squeegee head 13a is structured by a squeegee elevation mechanism 15 being disposed, by which a squeegee 16 is elevated and lowered, on a horizontal plate 14. By driving the squeegee elevation mechanism 15, the squeegee 16 is elevated and lowered, and is brought into contact with the upper side of the mask plate 12.

As shown in FIG. 2, a guide rail 27 is disposed in the Y direction on a bracket 26 disposed on a longitudinal frame 25, and a slider 28 slidably fitted in the guide rail 27 is connected with both ends of the plate 14. Therefore, the squeegee head 13a is made slidable in the Y direction. The plate 14 is allowed to horizontally move in the Y direction by a squeegee moving device constituted by a nut 30, a feed screw 29 and a squeegee moving motor (not illustrated) for rotating and driving the feed screw 29.

Next, a description is given of a cleaning mechanism for cleaning the underside of the mask plate 12 and of a camera head unit 17. As shown in FIG. 1, in the present embodiment, a cleaning head unit 18 is structured so as to move in the Y direction integrally with the camera head unit 17 to pick up the carrier 10 and the mask plate 12. The camera head unit 17 is provided with a substrate identification camera 17a to pick up individual substrates 11 held on the carrier 10 from above and a mask identification camera 17b to pick up the mask plate 12 from its underside, and the camera head unit 17 is mounted on a head X-axis table 19 (FIG. 2 and FIG. 3) and moves in the Y direction. By moving the camera head unit 17 in the X direction and Y direction and positioning the same between the substrate positioning portion 1 and the mask plate 12, the carrier 10 and the mask plate 12 can be identified at the same time.

As shown in FIG. 3, the cleaning head unit 18 is structured by disposing a paper roll 22A on which unused cleaning paper is wound, a paper roll 22B on which used cleaning paper is wound, and a cleaning head 21 on a horizontal unit base. Cleaning paper taken out from the paper roll 22A is collected onto the paper roll 22D via the cleaning head 21.

In FIG. 2, a guide rail 31 is disposed in the Y direction on the longitudinal frame 25, and a slider 32 that is slidably fitted in the guide rail 31 is connected with the head X-axis table 19 via a bracket 19a. Therefore, the head X-axis table 19 is made slidable in the Y direction. The head X-axis table 19 is allowed to horizontally move in the Y direction by a head Y-axis moving mechanism 20 consisting of a nut 34, a feed screw 33 and a head moving motor (not illustrated) for driving and rotating the feed screw 33.

When the carrier 10 and the mask plate 12 are not identified by the camera head unit 17 and the mask is not cleaned by the cleaning head unit 18, the camera head unit 17 and the cleaning head unit 18 are retracted from upward of the substrate positioning portion 1 to a standby position shown in FIG. 1. When the mask cleaning is carried out, the cleaning head unit 18 is moved in the Y direction along with the camera head unit 17 and is advanced downward of the mask plate 12. Then, the cleaning head 21 is elevated. By causing the cleaning head unit 18 to horizontally move with the cleaning paper pressed to the underside of the mask plate 12 by the cleaning head 21, the underside of the mask plate 12 is wiped off and cleaned.

Next, a description is given of a printing operation by the screen printing mechanism 13. First, when the carrier 10 is conveyed to the printing position by the substrate conveyance mechanism 8, the substrate underside receiving portion 7 is elevated by driving the second Z-axis table 6 in order to receive the underside of the carrier 10. The substrate positioning portion 1 is driven based on the positioning parameters in this state, and the carrier 10 is positioned in the X and Y directions with respect to the mask plate 12. Thereby, each of the electrodes 11a (FIG. 4A) of individual substrates 11 held by the carrier 10 are positioned to the pattern holes 12a (FIG. 4B) disposed on the mask plate 12. That is, the substrate positioning portion 1 is made into positioning means for planarly positioning the carrier 10 with respect to the mask plate 12 based on the positioning parameters.

After that, the carrier 10 is elevated along with the substrate conveyance mechanism 8 by driving the first Z-axis table 5, and is brought into contact with the underside of the mask plate 12. Next, the carrier 10 is clamped by the clamp mechanism 9. Therefore, in squeegeeing by the squeegee head 13a, the horizontal position of the carrier 10 is fixed. In this state, by carrying out a squeegeeing operation in which the squeegee 16 is in sliding contact with the mask plate 12 and the squeegee 16 is caused to slide on the mask plate 12 to which a soldering paste is supplied, the soldering paste S is collectively printed via pattern holes 12a onto each of the electrodes 11a of a plurality of individual substrates 11 held on the carrier 10 as shown in FIG. 4C.

Next, referring to FIG. 5, a description is given of a configuration of a control system. In FIG. 5, a control portion 40 totally controls respective portions described below. A memory portion 41 stores various types of data such as various types of programs necessary to control processing by the control portion 40 and control parameters used to control operations and calculations. The control parameters include positioning parameters for positioning the carrier 10 having individual substrates 11 held thereon with respect to the mask plate 12 by the substrate positioning portion 1. A data updating portion 42 carries out a data rewriting process to update the control parameters stored in the memory portion 41.

Figure 6A:
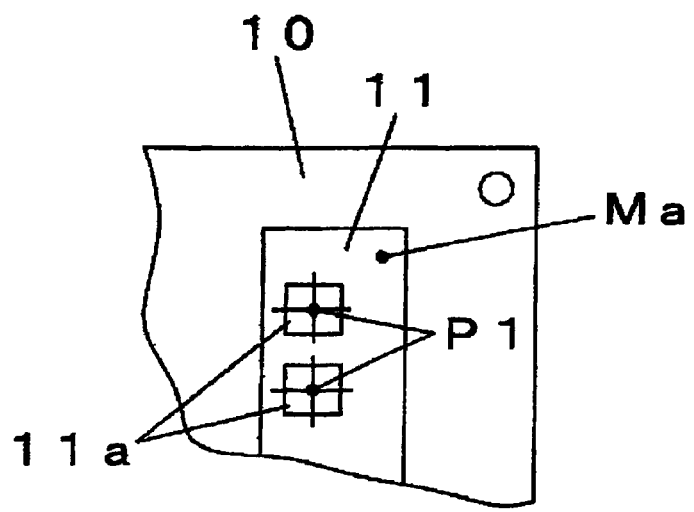
FIG. 6 is a schematic view showing soldering position deviation in a screen printing method according to one embodiment of the present invention.

An image identification portion 43 carries out an identification process of data picked up by the substrate identification camera 17a and the mask identification camera 17b. A print inspection portion 44 carries out, based on the identification result, a print inspection process to determine whether or not the solder printing state is satisfactory and to execute feedback. A description is given of detection of soldering position deviation, which is carried out by the print inspection process, with reference to FIGS. 6A to 6C. As shown in FIG. 6A, by executing an identification process of picked up data obtained by picking up each of the individual substrates 11 before screen printing, by means of the substrate identification camera 17a, the positions of position identification marks Ma and Mb are detected in each of the individual substrates 11. Electrode positions P1 indicating the positions of each of the electrodes 11a are calculated based on the detection result and the electrode position data already known.

Figure 6B:
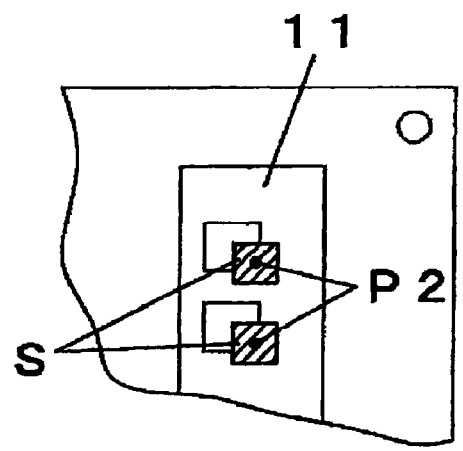
Figure 6C:
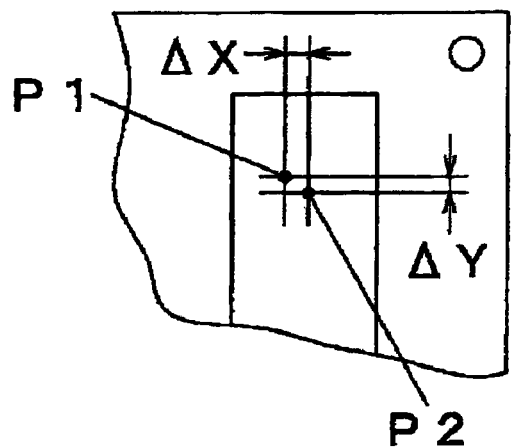

By identifying data picked up by picking up each of the screen-printed individual substrates 11 by the substrate identification camera 17a, the soldering printed position P2 indicating the soldering paste S printed on electrodes 11a can be detected as shown in FIG. 6B. Positional deviation quantities $\Delta X$ and $\Delta Y$ between the electrode positions P1 and the soldering printed positions P2 are calculated for each electrode 11a with respect to each of the individual substrates 11 (FIG. 6C), whereby the soldering position deviation data is obtained. That is, the print inspection portion 44 detects the position of printing paste S, which is printed on each of the individual substrates 11, and detects the positional deviation state of the soldering paste S with respect to the electrode 11a as soldering position deviation data indicating the positional deviation quantities ($\Delta X$ and $\Delta Y$) for each electrode.

A feedback supply portion 45 supplies feedback data to improve positional deviation states of printed soldering paste S based on the statistical data of individual substrate positional deviation, which is obtained by statistically processing the positional deviation quantities obtained by the print inspection portion 44 for each of the individual substrates. Supplied feedback data is written in the memory portion 41 by the data updating portion 42, thereby updating the positioning parameters to control operations of the substrate positioning portion 1. The mechanism control portion 46 carries out operation control of the screen printing mechanism 13 and the substrate positioning portion 1 based on control parameters stored in the memory portion 41. The mechanism control portion 46 controls the substrate positioning portion 1 based on the positioning parameters updated by the data updating portion 42, whereby the positional deviation states shown in FIG. 6B are improved.

Next, in a screen printing method for collectively printing, by means of the screen printing apparatus, a soldering paste S onto the electrodes 11a for connecting electronic components, which are formed on each of the individual substrates, with respect to a plurality of individual substrates 11 held on the carrier 10, a description is given of feedback data supply calculations that are executed to improve the soldering position slipping states, with reference to FIG. 7A to FIG. 8D.

Figure 7A:
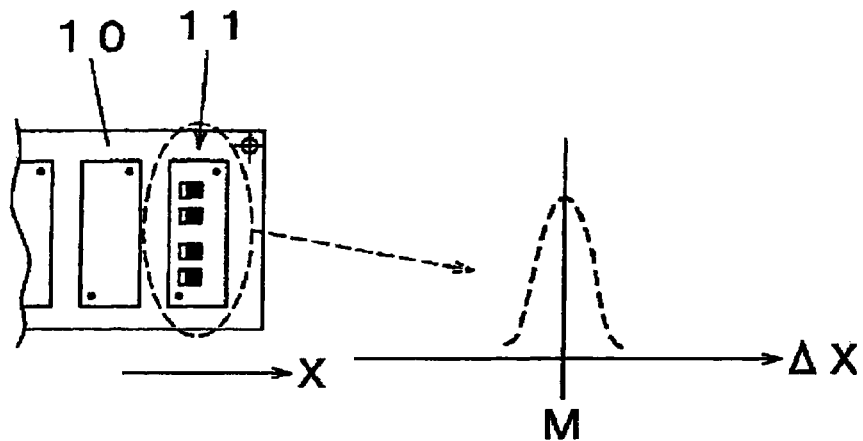
FIG. 7 is a schematic view showing a feedback data supply process in a screen printing method according to one embodiment of the present invention.
Figure 7B:
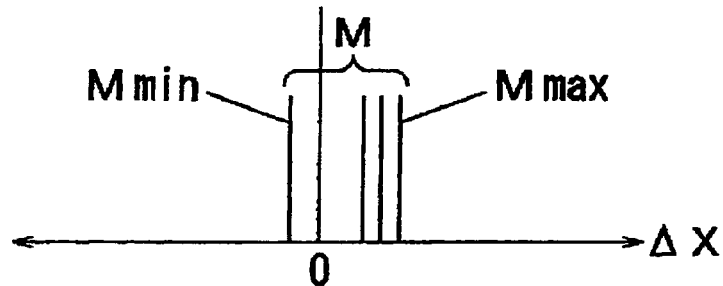

First, FIG. 7A shows statistical data of individual substrate position deviation, which is obtained for one individual substrate 11 of a plurality of individual substrates 11 held on the carrier 10, that is, distribution of the positional deviation quantities in the X direction and the average value M of individual positional deviation. Also, herein, although a description is given only of feedback of the positional deviation quantity in the X direction, the feedback with respect to the Y direction can be carried out as well. Calculations to obtain the average values M of individual positional deviation are carried out for all the individual substrates 11 held on the carrier 10, and as shown in FIG. 7B, the maximum value Mmax and the minimum value Mmin of these average values M of individual positional deviation are obtained.

Figure 7C:
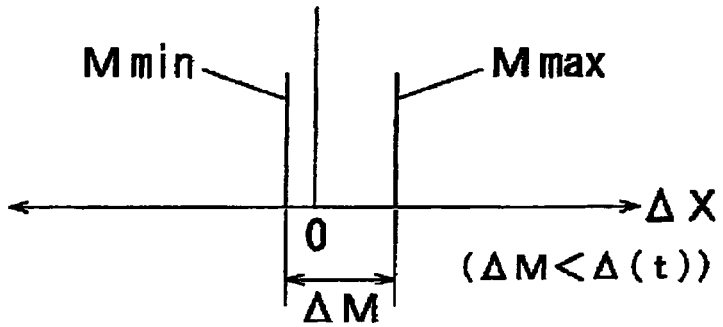
Figure 7D:
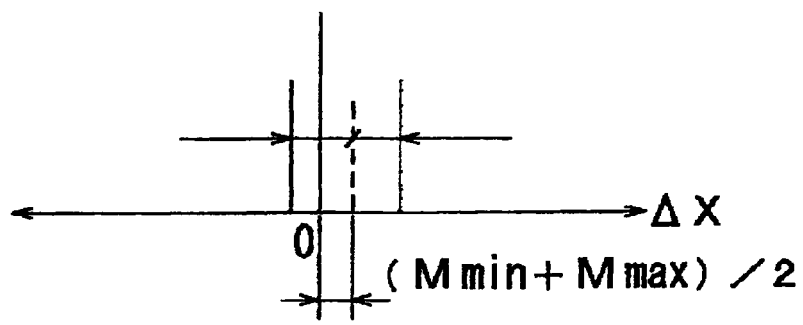

Next, as shown in FIG. 7C, a deviation value $\Delta M$ indicating a difference between the maximum value Mmax and the minimum value Mmin is calculated, and the deviation value $\Delta M$ is compared with the tolerance value $\Delta(t)$ set in advance. Herein, if the deviation value $\Delta M$ is less than or equal to the tolerance value $\Delta(t)$, an intermediate value (Mmax+Mmin)/2 of the maximum value Mmax and the minimum value Mmin is obtained. And, the intermediate value (Mmax+Mmin)/2 obtained here by the calculation is regarded as the representative value of the positional deviation quantities of soldering, which is generated for a plurality of individual substrates 11 held on the carrier 10, and the positioning parameters stored in the memory portion 41 are updated by the data updating portion 42 based on the intermediate value (Mmax+Mmin)/2. That is, using the intermediate value (Mmax+Mmin)/2 as a correction value, a data updating process is carried out by which the positioning parameters are shifted in the direction opposite to the positional displacement direction only by the correction value. Therefore, in screen printing operations subsequently carried out, the positional deviation quantities can be reduced by the correction value. Herein, the tolerance value $\Delta(t)$ is set by determining whether or not it is in a range of positional deviation quantity that covers the positional deviation and can secure normal mounting quality of electronic components in an electronic component mounting process and a soldering reflow process, which are subsequent processes of the screen printing apparatus.

Figure 8A:
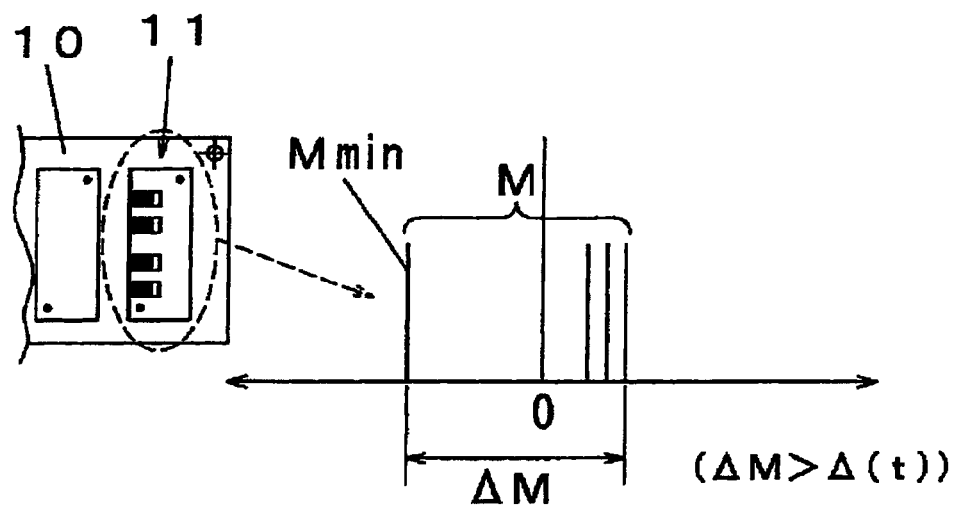
FIG. 8 is a schematic view showing a feedback data supply process in a screen printing method according to one embodiment of the present invention.
Figure 8B:
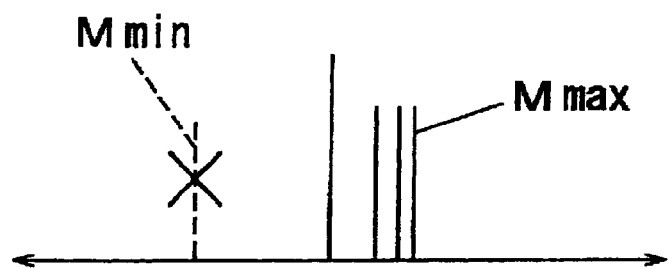

FIGS. 8A to 8D show an example of a case where only one individual substrate 11 among a plurality of individual substrates 11 held on the carrier 10 is subjected to large positional deviation in comparison with the other individual substrates. Such an example may be brought about where screen printing is carried out without correcting a positional error occurring due to a certain reason when mounting the individual substrates 11 on the carrier 10. That is, in this case, as shown in FIG. 8A, the average value M of individual positional deviation obtained for one individual substrate 11 appears as a numerical value widely apart from a group of the average values M of individual positional deviation for the other individual substrates 11 in the statistical data of soldering position deviation. As a result, the calculated deviation value $\Delta M$ becomes large in comparison with normal states, and exceeds the above-described tolerance value $\Delta t$. In the example shown in FIGS. 8A to 8D, the minimum value Mmin of the average values M of individual positional deviation indicates a value greatly different from the other average values M.

Figure 8C:
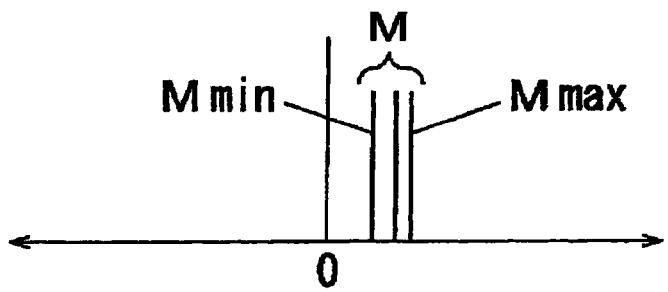
Figure 8D:
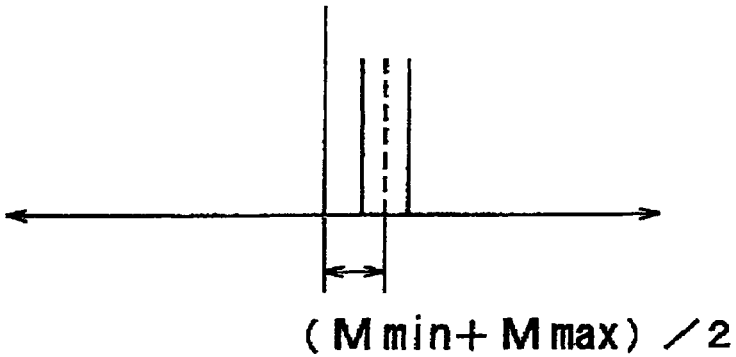

In such a case, a data value (herein, the minimum value Mmin) in which the degree of deviation is greater in the distribution of a plurality of average values M of individual positional deviation among the maximum values Mmax and the minimum values Mmin is discarded as an abnormal value. For example, a difference from the average value of the positional deviation quantities with respect to all the individual substrates 11 may be used as the index of the deviation value, and data of the numerical value in which the difference from the average value is even larger is discarded as an abnormal value. And, the above-described feedback data supply calculation is repeated and carried out again with respect to the remaining average values of individual positional deviation, from which the abnormal value is discarded. That is, as shown in FIG. 8C, with respect to the remaining average values M of individual positional deviation, the maximum value Mmax and the minimum value Mmin are obtained. Further, as shown in, FIG. 8D, the intermediate value (Mmax+Mmin)/2 is obtained as well. The positioning parameters stored in the memory portion 41 are updated by the data updating portion 42 based on the thus obtained intermediate value (Mmax+Mmin)/2.

That is, in the screen printing method shown in the present embodiment, in the feedback data supplying step executed by the feedback data supply portion 45, a plurality of average values M of individual positional deviation indicating the average values of positional deviation quantities for each of the individual substrates are obtained from the soldering position deviation data, next, the deviation value ΔM indicating a difference between the maximum value Mmax and the minimum value Mmin of the plurality of average values M of individual positional deviation is compared with the tolerance value Δ(t) set in advance, a feedback data supply calculation that obtains an intermediate value (Mmax+Mmin)/2 of the maximum value Mmax and the minimum value Mmin it the deviation value ΔM is less than or equal to the tolerance value Δ(t), and the positioning parameters stored in the memory portion 41 are obtained by the data updating portion 42 based on the intermediate value (Mmax+Mmin)/2. If the deviation value ΔM exceeds the tolerance value Δ(t), a data value in which the degree of deviation is larger in the plurality of average values M of individual positional deviation among the maximum values Mmax and the minimum value Mmin is discarded as an abnormal value, wherein a feedback data supply calculation is carried out with respect to the remaining average values M of the remaining individual positional deviation.

By thus processing the data, abnormal data occurring due to factors regardless of a positioning error inherent to the individual substrates 11 and the mask plate 12 by the substrate positioning portion 1, such as a positional deviation resulting from a mounting error of the individual substrates 11, can be excluded from the object in the feedback data supply. Therefore, even in a case where abnormal data by which a specified individual substrate greatly slips due to a certain cause in comparison with the others, it is possible to prevent inappropriate correction data from being fed back to the upstream side by incorrect data resulting from an abnormal state being brought in as feedback data, wherein feedback of an appropriate printing position is ensured. Also, the feedback data supply is not limited to the example described and illustrated, and various methods appropriate to individual substrates may be adopted.

The screen printing apparatus and screen printing method according to the present invention can bring about an effect by which an appropriate printing position can be fed back even in a case where abnormal data by which a specified individual substrate greatly slips due to a certain cause in comparison with the other individual substrates, and is useful in the field of printing a soldering paste with respect to a plurality of individual substrates held on a carrier.

The present application is based on Japanese patent application No 2007-135134, filed on May 22, 2007, the entire contents of which are incorporated herein by reference.

What is claimed is:

1. A screen printing apparatus for collectively printing a soldering paste on electrodes for connecting electronic components, which are formed on individual substrates, with respect to a plurality of individual substrates held on a carrier, comprising:
   a mask plate provided with pattern holes corresponding to the electrodes;
   a positioning device for two-dimensionally positioning the carrier with respect to the mask plate based on positioning parameters;
   a squeegee for printing a soldering paste on the electrodes via the pattern holes by executing a squeegeeing motion in sliding contact with the mask plate;
   a print inspection portion for detecting a position of the soldering paste printed on each individual substrate and detecting position deviation quantity of the soldering paste with respect to the electrodes as soldering position deviation data indicating positional deviation quantity for the electrodes;
   a feedback data supply portion for supplying feedback data to improve the positional deviation state based on statistical data of positional deviation quantity for individual substrates, in which the positional deviation quantities are statistically processed for each individual substrate; and
   a data updating portion for updating the positioning parameters based on the feedback data,
   wherein the feedback data supply portion obtains a plurality of average values of individual positional deviation quantities from the soldering position deviation data which indicate an average value of the positional deviation quantity for each individual substrate, and then compares a deviation value, which indicates a difference between a maximum value and a minimum value of the average values of the individual positional deviation quantities, with tolerance values predetermined in advance, and carries out a calculation for supplying feedback data, by which a mean value of the maximum value and the minimum value is obtained, if the deviation value is less than or equal to the tolerance value, and
   the data updating portion updates the positioning parameters based on the mean value.

2. The screen printing apparatus according to claim 1, wherein the feedback data supply portion discards, as abnormal values, data values having a greater degree of deviation in a plurality of average values of individual position deviation among the maximum value and the minimum value if the deviation value exceeds the tolerance value, and carries out calculations for supplying the feedback data with respect to the remaining individual positional deviation average values.

3. A screen printing method for collectively printing a soldering paste on electrodes for connecting electronic components, which are formed on individual substrates, with respect to a plurality of individual substrates held on a carrier, by a screen printing apparatus, comprising the steps of:
   providing a mask plate with pattern holes corresponding to the electrodes;
   two-dimensionally positioning the carrier with respect to the mask plate based on positioning parameters;
   printing a soldering paste on the electrodes via the pattern holes by executing a squeegeeing motion in sliding contact with the mask plate;
   detecting a position of the soldering paste printed on each of the individual substrates and detecting positional deviation quantity of the soldering paste with respect to the electrodes as soldering position deviation data indicating a positional deviation quantity for each electrode;
   supplying feedback data to improve a positional deviation state based on statistical data of positional deviation quantity for individual substrates, in which the positional deviation quantities are statistically processed for each individual substrate;
   obtaining a plurality of average values of individual positional deviation quantities from the soldering position deviation data which indicate an average value of the positional deviation quantity for each individual substrate;

comparing a deviation value indicating a difference between a maximum value and a minimum value of the average values of positional deviation quantities with tolerance values predetermined in advance;

carrying out a calculation for supplying feedback data, by which a mean value of the maximum value and the minimum value is obtained, if the deviation value is less than or equal to the tolerance value; and updating the positioning parameters based on the mean value, wherein in the feedback data supplying step, data values having a greater degree of deviation in a plurality of average values of individual position deviation among the maximum value and the minimum value are discarded as abnormal values if the deviation value exceeds the tolerance value, and calculations for supplying the feedback data are carried out with respect to the remaining individual positional deviation average values.

* * * * *